(12) United States Patent  
Lan et al.

(10) Patent No.: US 9,040,987 B2  
(45) Date of Patent: May 26, 2015

(54) SEMICONDUCTOR DEVICE

(71) Applicant: E Ink Holdings Inc., Hsinchu (TW)

(72) Inventors: Wei-Chou Lan, Hsinchu (TW); Ted-Hong Shinn, Hsinchu (TW); Henry Wang, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 1 day.

(21) Appl. No.: 13/721,026

(22) Filed: Dec. 20, 2012

(65) Prior Publication Data

US 2013/0228779 A1     Sep. 5, 2013

(30) Foreign Application Priority Data

Mar. 1, 2012  (TW) .............................. 101106741 A

(51) Int. Cl.
*H01L 29/786* (2006.01)
*H01L 27/12* (2006.01)
*H01L 29/417* (2006.01)

(52) U.S. Cl.
CPC ......... *H01L 29/786* (2013.01); *H01L 29/41733* (2013.01); *H01L 29/78603* (2013.01); *H01L 29/78696* (2013.01); *H01L 27/1218* (2013.01); *H01L 27/124* (2013.01)

(58) Field of Classification Search
USPC ........... 257/49, 57, 59, 66, 330, 347; 438/151
See application file for complete search history.

(56) References Cited

U.S. PATENT DOCUMENTS

| | | | |
|---|---|---|---|
| 6,008,505 A | 12/1999 | Cho | |
| 6,107,662 A | 8/2000 | Kim | |
| 6,268,625 B1 | 7/2001 | Lee | |
| 6,639,281 B2 * | 10/2003 | Kane et al. | 257/350 |
| 6,806,917 B2 * | 10/2004 | Sekine et al. | 349/43 |
| 7,277,138 B2 * | 10/2007 | Cho et al. | 349/46 |
| 7,659,571 B2 | 2/2010 | Yamazaki | |
| 8,324,033 B2 * | 12/2012 | Wang et al. | 438/158 |

(Continued)

FOREIGN PATENT DOCUMENTS

| | | |
|---|---|---|
| CN | 101000916 | 7/2007 |
| JP | 2009063603 | 3/2009 |
| KR | 1020070065187 | 6/2007 |

OTHER PUBLICATIONS

"Office Action of Taiwan Counterpart Application," issued on Dec. 25, 2014, p. 1-p. 5.

(Continued)

*Primary Examiner* — Bradley K Smith  
*Assistant Examiner* — David Goodwin  
(74) *Attorney, Agent, or Firm* — Jianq Chyun IP Office

(57) ABSTRACT

A semiconductor device including a substrate, a metal layer, an insulating layer, a semiconductor layer, a drain and a source is provided. The substrate has a surface and a first cavity. The metal layer is disposed on the substrate and covers the surface and inner-wall of the first cavity to define a second cavity corresponding to the first cavity. The insulating layer covers the metal layer and inner-wall of the second cavity to define a third cavity corresponding to the second cavity. The semiconductor layer exposes a portion of the insulating layer and covers the inner-wall of the third cavity to define a fourth cavity corresponding to the third cavity. The drain and source are disposed on the semiconductor layer and covers a portion of the semiconductor layer and a portion of the insulating layer, in which the drain and source expose the fourth cavity.

13 Claims, 5 Drawing Sheets

(56) References Cited

U.S. PATENT DOCUMENTS

2002/0145144 A1 10/2002 Kane et al.
2004/0263746 A1 12/2004 Cho et al.
2008/0164470 A1 7/2008 Wang et al.

OTHER PUBLICATIONS

"Office Action of China Counterpart Application," issued on Mar. 25, 2015, p1-p7, in which the listed references were cited.

* cited by examiner

US 9,040,987 B2

SEMICONDUCTOR DEVICE

CROSS-REFERENCE TO RELATED APPLICATION

This application claims the priority benefit of Taiwan application serial no. 101106741, filed on Mar. 1, 2012. The entirety of the above-mentioned patent application is hereby incorporated by reference herein and made a part of this specification.

BACKGROUND OF THE INVENTION

1. Field of the Invention

The invention generally relates to a semiconductor device, and more particularly, to a semiconductor device in three-dimensional figure.

2. Description of Related Art

In recent years, thanks to progress of semiconductor process technology, the manufacturing of thin film transistor (TFT) gains easier and faster. TFT has quite broad applications, for example, in computer chip, mobile chip or thin film transistor liquid crystal display (TFT LCD). Taking the TFT LCD as an example, the TFT therein is used as charging or discharging switches to control the displaying of every pixel.

Along with the higher and higher demands of various electronic products on component characteristics, the TFT needs continuously gearing to high output current direction for its development. In general speaking, in order to further increase the TFT output current, the dimension of the TFT must be increased. Under a limited area of panel condition however, the increasing dimension of the TFT certainly squeezes the space for deposing other circuit wires or components and meanwhile, the aperture ratio of pixel electrode is affected. As a result, the development of TFT is limited.

SUMMARY OF THE INVENTION

Accordingly, the invention is directed to a semiconductor device occupying smaller layout area and able to increase the layout area of other components on substrate.

The invention provides a semiconductor device, which is disposed on a base-plate and includes a substrate, a metal layer, an insulating layer, a semiconductor layer, a drain and a source. The substrate has a surface and a first cavity located at the surface. The metal layer is disposed on the substrate and covers the surface and an inner-wall of the first cavity so as to define a second cavity corresponding to the first cavity. The insulating layer is disposed on the metal layer and covers the metal layer and an inner-wall of the second cavity so as to define a third cavity corresponding to the second cavity. The semiconductor layer is disposed on the insulating layer, exposes a portion of the insulating layer and covers an inner-wall of the third cavity so as to define a fourth cavity corresponding to the third cavity. The drain is disposed on the semiconductor layer and covers a portion of the semiconductor layer and a portion of the insulating layer, in which the drain exposes the fourth cavity. The source is disposed on the semiconductor layer and covers a portion of the semiconductor layer and a portion of the insulating layer, in which the source exposes the fourth cavity.

In an embodiment of the present invention, a material of the above-mentioned substrate includes organic material or inorganic material.

In an embodiment of the present invention, a depth of the above-mentioned first cavity is ¼-9/10 of a thickness of the substrate.

In an embodiment of the present invention, an opening diameter of the above-mentioned second cavity is less than an opening diameter of the first cavity.

In an embodiment of the present invention, an opening diameter of the above-mentioned third cavity is less than an opening diameter of the second cavity.

In an embodiment of the present invention, an opening diameter of the above-mentioned fourth cavity is less than an opening diameter of the third cavity.

In an embodiment of the present invention, the above-mentioned semiconductor device further includes a three-dimensional connecting circuit disposed on the insulating layer and connected to the source, in which the three-dimensional connecting circuit includes a first conductive layer, a filled material and a second conductive layer, the first conductive layer and the second conductive layer encapsulate the filled material, and a material of the filled material is different from that of the first conductive layer and the second conductive layer.

In an embodiment of the present invention, the above-mentioned filled material includes organic material, polymer material or polymer material containing a plurality of metallic particles.

In an embodiment of the present invention, the above-mentioned material of the metallic particles includes silver or carbon.

In an embodiment of the present invention, the above-mentioned drain is in finger branch shape and has a plurality of first branches, the source is in finger branch shape and has a plurality of second branches, and the first branches and the second branches extend into the fourth cavity and are parallel to each other and alternately arranged.

In an embodiment of the present invention, the above-mentioned semiconductor device further includes a protection layer disposed on the substrate and covers the semiconductor layer, the drain, the source and the fourth cavity, in which the protection layer exposes a portion of the drain.

In an embodiment of the present invention, the above-mentioned semiconductor device further includes a pixel electrode disposed on the substrate and connected to the portion of the drain exposed by the protection layer.

Based on the description above, the semiconductor device of the invention is designed to save the layout area of the component layer (including the metal layer, the insulating layer, the semiconductor layer, the drain and the source) on the surface of the substrate. Hence, the semiconductor device of the invention is advantageous not only in occupying a smaller layout area to allow increasing the layout area of other components on the substrate, but also in increasing the aperture ratio.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1A:
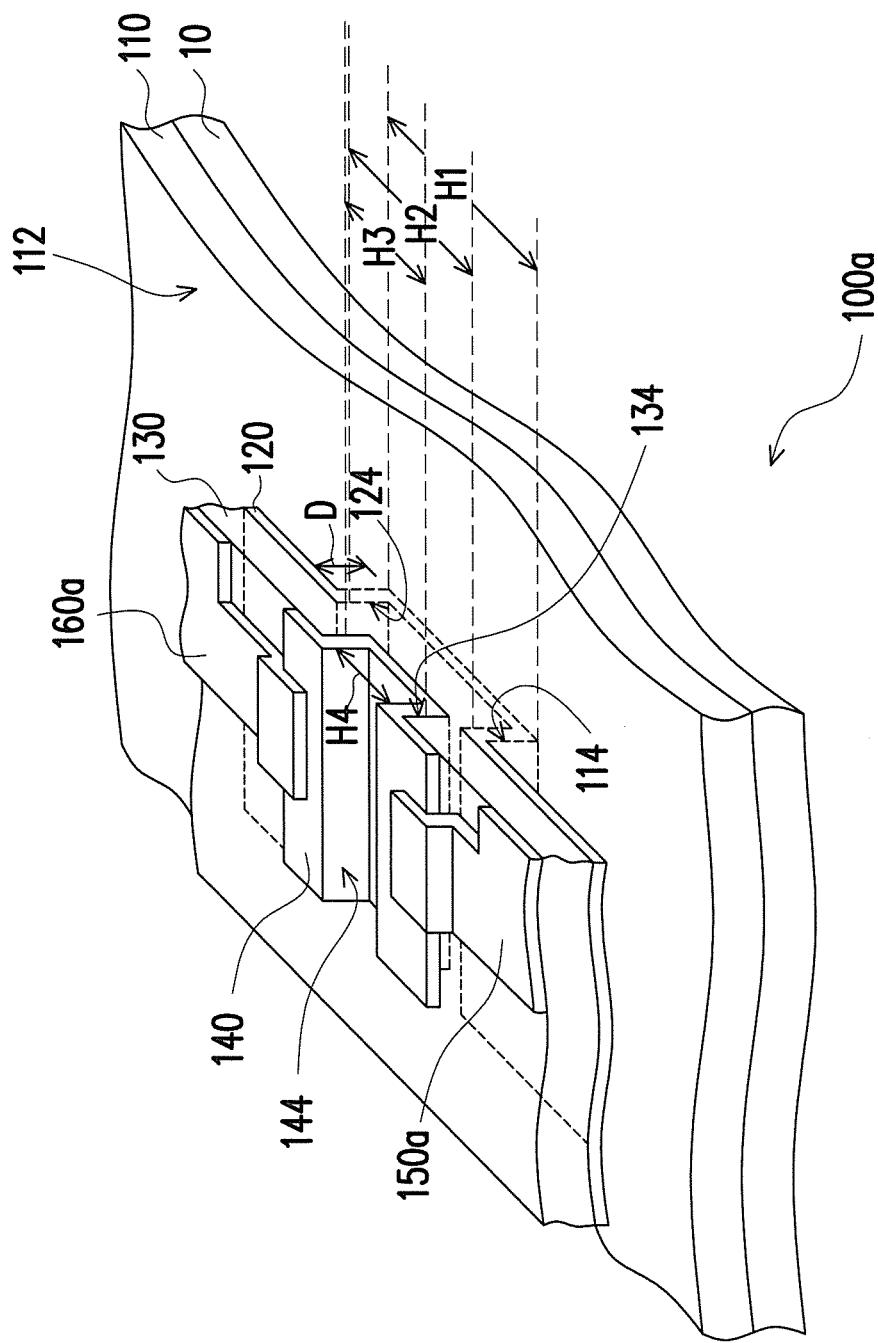
FIG. 1A is a schematic three-dimensional diagram of a semiconductor device according to an embodiment of the invention.
Figure 1B:
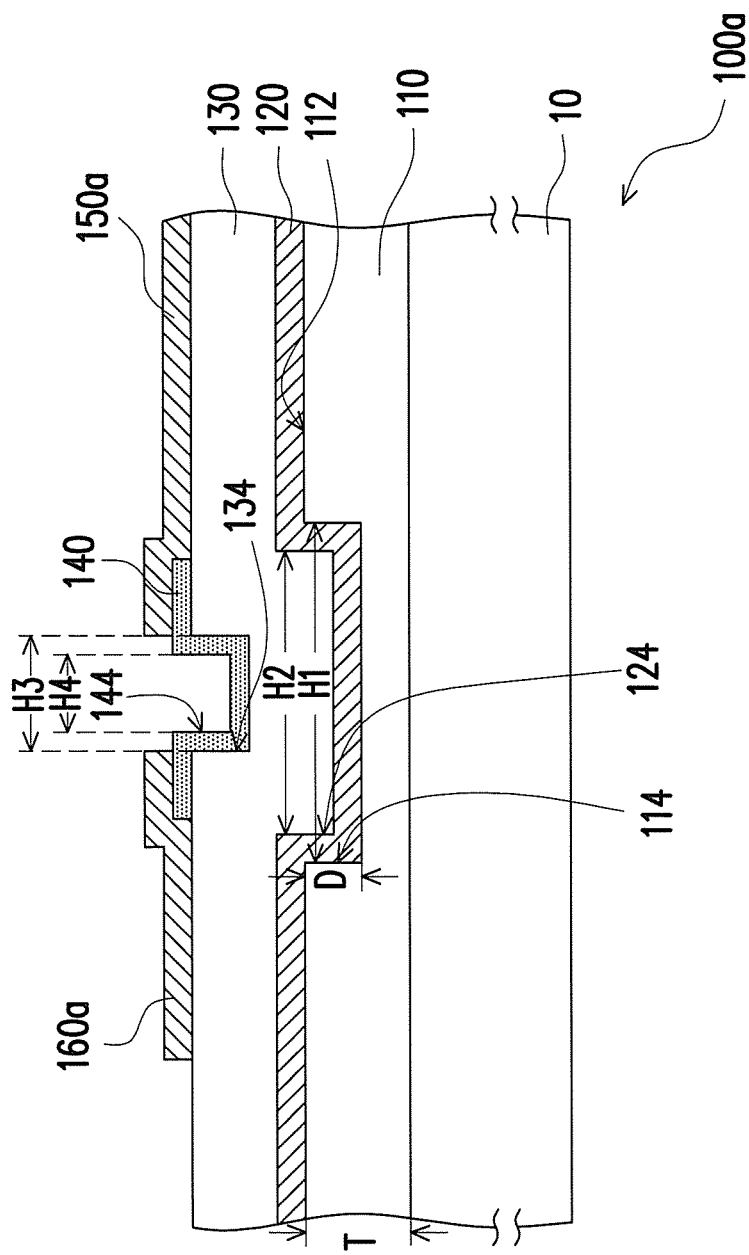
FIG. 1B is a cross-sectional diagram of the semiconductor device of FIG. 1A.

FIG. 1A is a schematic three-dimensional diagram of a semiconductor device according to an embodiment of the invention and FIG. 1B is a cross-sectional diagram of the semiconductor device of FIG. 1A. Referring to FIGS. 1A and 1B, a semiconductor device 100a of the embodiment is disposed on a base-plate 10, and the semiconductor device 100a includes a substrate 110, a metal layer 120, an insulating layer 130, a semiconductor layer 140, a drain 150a and a source 160a. The semiconductor device 100a herein is an active device, for example, a TFT.

In more details, the substrate 110 has a surface 112 and a first cavity 114 located at the surface 112. In the embodiment, a material of the substrate 110 is, for example, organic material or inorganic material, wherein the organic material is, for example, polyimide (PI) or polysiloxane (PSI), while the inorganic is, for example, silicon-oxide (SiOx) or silicon-nitride (SiNx). In addition, a depth D of the first cavity 114 is, for example, ¼-9/10 of a thickness T of the substrate 110.

The metal layer 120 is disposed on the substrate 110 and covers the surface 112 of the substrate 110 and an inner-wall of the first cavity 114 so as to define a second cavity 124 corresponding to the first cavity 114. The second cavity 124 and the first cavity 114 are conformally disposed and an opening diameter H2 of the second cavity 124 is less than an opening diameter H1 of the first cavity 114. The insulating layer 130 is disposed on the metal layer 120 and covers the metal layer 120 and an inner-wall of the second cavity 124 so as to define a third cavity 134 corresponding to the second cavity 124. The third cavity 134 and the second cavity 124 are conformally disposed and an opening diameter H3 of the third cavity 134 is less than an opening diameter H2 of the second cavity 124. The semiconductor layer 140 is disposed on the insulating layer 130 and exposes the partial insulating layer 130, in which the semiconductor layer 140 covers an inner-wall of the third cavity 134 so as to define a fourth cavity 144 corresponding to the third cavity 134. The fourth cavity 144 and the third cavity 134 are conformally disposed and an opening diameter H4 of the fourth cavity 144 is less than an opening diameter H3 of the third cavity 134. The drain 150a is disposed on the semiconductor layer 140 and covers the partial semiconductor layer 140 and the partial insulating layer 130, in which the drain 150a exposes the fourth cavity 144 of the semiconductor layer 140. The source 160a is disposed on the semiconductor layer 140 and covers the partial semiconductor layer 140 and the partial insulating layer 130, in which the source 160a exposes the fourth cavity 144 of the semiconductor layer 140.

Since the substrate 110 of the embodiment has the first cavity 114 and the metal layer 120, the insulating layer 130, the semiconductor layer 140, the drain 150a and the source 160a are sequentially stacked on the surface 112 of the substrate 110 and in the first cavity 114 to form the semiconductor device 100a in three-dimensional figure, so that the semiconductor device 100a of the embodiment is advantageous in occupying a smaller layout area and the saved area can be used to increase disposing other components (for example, electrodes, not shown), which can expand the application range of the semiconductor device 100a and increase the aperture ratio. In addition, since the semiconductor layer 140 of the embodiment covers the inner-wall of the third cavity 134 of the insulating layer 130, in comparison with the conventional planar TFT, the semiconductor layer 140 has a longer channel length, and the horizontal distance between the drain 150a and the source 160a is shorter to further advance the output current. Moreover, the semiconductor layer 140 of the embodiment completely overlaps the metal layer 120 so as to better control the semiconductor device 100a and have good electrical performance.

It should be noted that the following embodiments, the component notations and partial details of the structures hereinafter provided can be the same as or similar to the previous embodiment, wherein the same notations represent the same or similar components while the repeated same details are omitted, which can refer to the previous embodiment.

Figure 2:
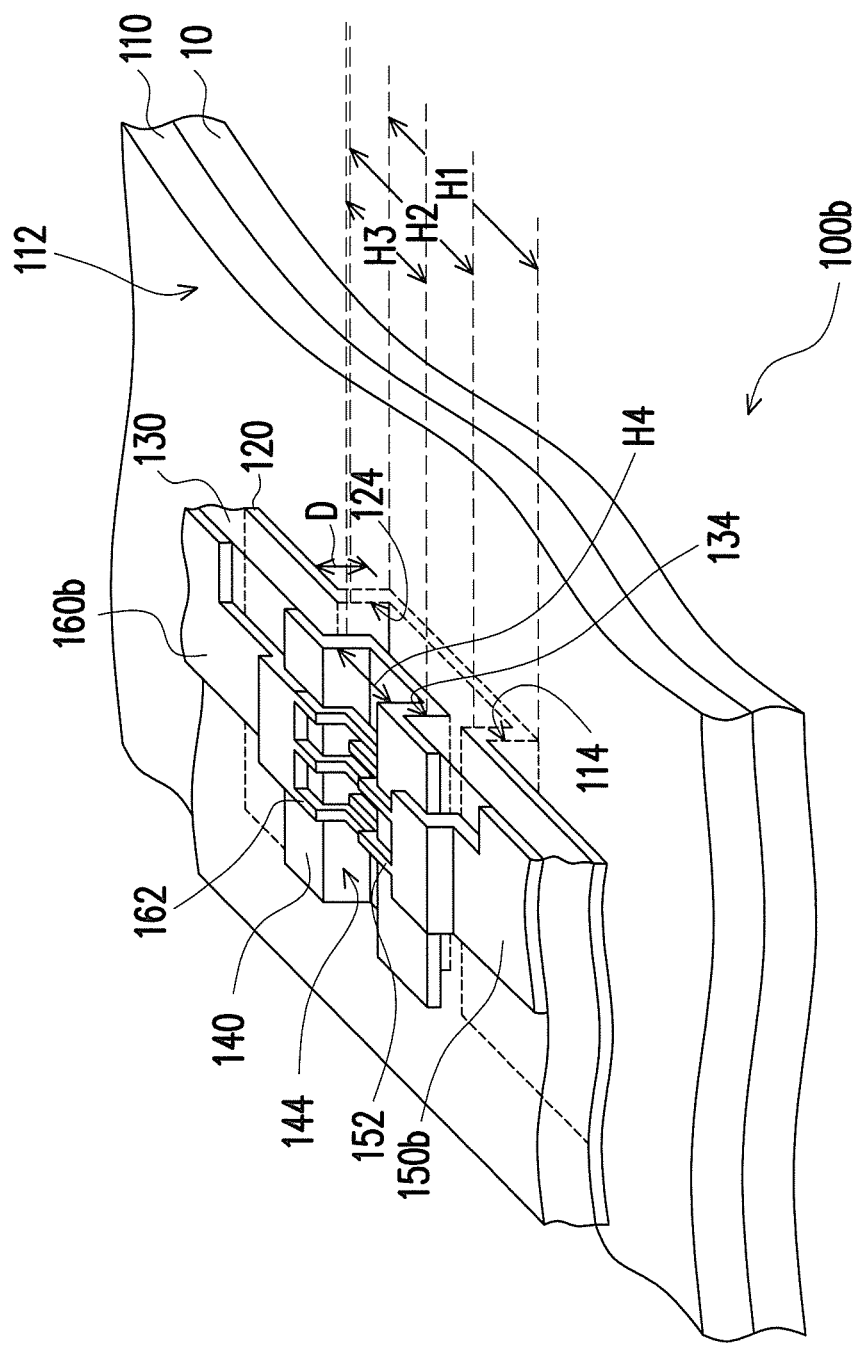
FIG. 2 is a schematic three-dimensional diagram of a semiconductor device according to another embodiment of the invention.

FIG. 2 is a schematic three-dimensional diagram of a semiconductor device according to another embodiment of the invention. Referring to FIG. 2, the semiconductor device 100b of the embodiment is similar to the semiconductor device 100a of FIG. 1A except that the drain 150b of the embodiment is in finger branch shape and has a plurality of first branches 152 and the source 160b is also in finger branch shape and has a plurality of second branches 162. These first branches 152 and these second branches 162 are parallel to each other and alternately arranged. In this way, the semiconductor layer 140 exposed by the drain 150b and the source 160b has a longer channel length to effectively advance the output current of the semiconductor device 100b.

Figure 3:
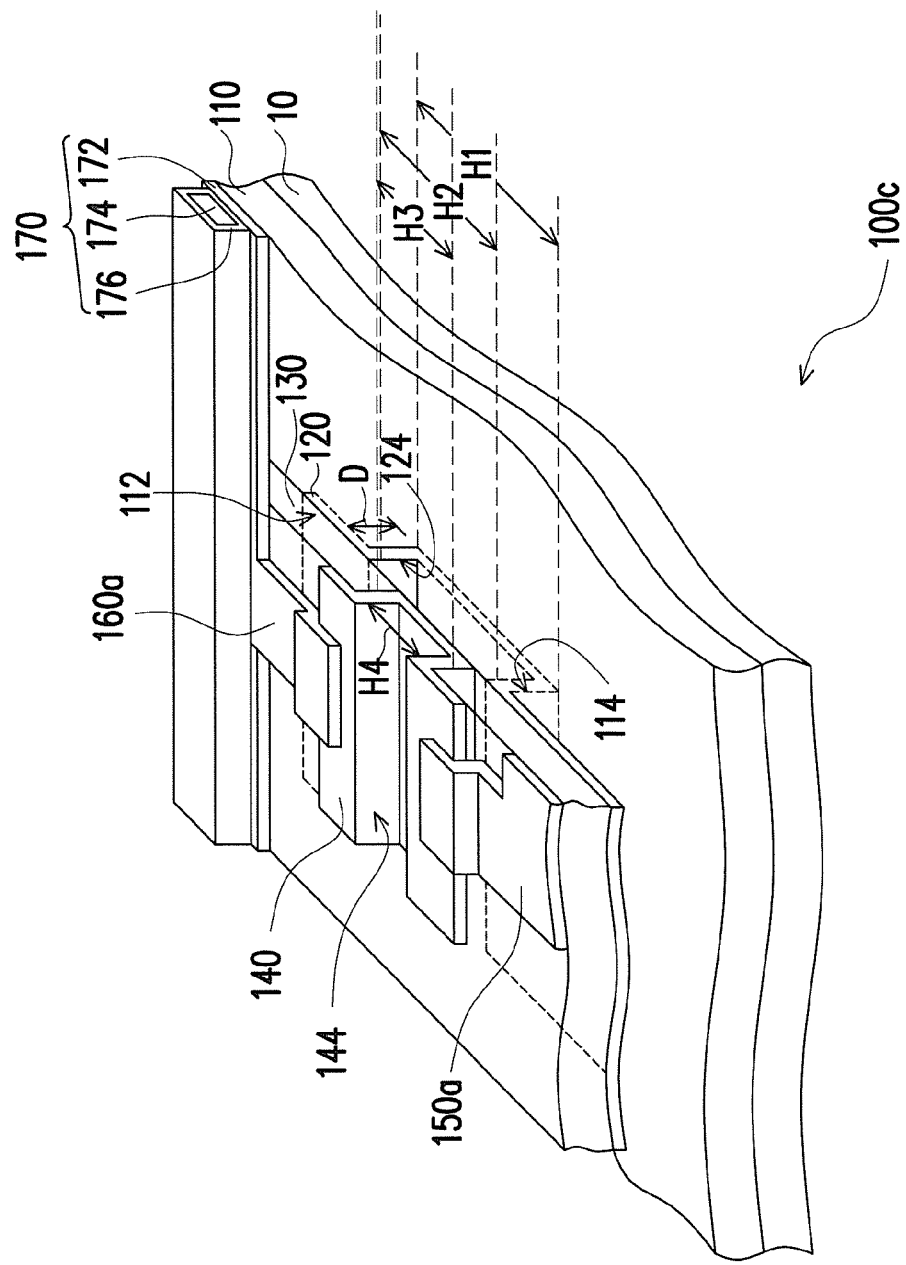
FIG. 3 is a schematic three-dimensional diagram of a semiconductor device according to yet another embodiment of the invention.

FIG. 3 is a schematic three-dimensional diagram of a semiconductor device according to yet another embodiment of the invention. Referring to FIG. 3, the semiconductor device 100c of the embodiment is similar to the semiconductor device 100a of FIG. 1A except that the semiconductor device 100c of the embodiment further includes a three-dimensional connecting circuit 170 disposed on the insulating layer 130 and the three-dimensional connecting circuit 170 connects the source 160a both in structure and in electricity.

In more details, the three-dimensional connecting circuit 170 includes a first conductive layer 172, a filled material 174 and a second conductive layer 176, in which the first conductive layer 172 and the second conductive layer 176 encapsulate the filled material 174. A material of the filled material 174 is different from that of the first conductive layer 172 and the second conductive layer 176. In the embodiment, the second conductive layer 176 completely encapsulates the filled material 174. The filled material 174 in the embodiment can be, for example, the same as the material of the substrate 110, such as non-conductive organic material or non-conductive polymer material. Certainly, the filled material 174 can be also polymer material containing a plurality of metallic particles, in which the material of the metallic particles is, for example, silver or carbon and the filled material 174 is conductive. It should be noted that the conductivity of the filled material 174 affects the resistance of the whole three-dimensional connecting circuit 170. When the filled material 174 is conductive, in comparison with the non-conductive filled material 174, the filled material 174 can more reduce the resistance of the three-dimensional connecting circuit 170. In other words, the embodiment does not limit the material type of the filled material 174. People skilled in the art can select the type of the filled material 174 according to the real requirement to achieve the desired technical effect. In addition, the materials of the first conductive layer 172 and the second conductive layer 176 are, for example, metal (including molybdenum, chromium, aluminium or other appropriate materials), or alloys (chromium molybdenum, i.e., MoCr, or other appropriate materials), which the invention is not limited to. Moreover, the material of the first conductive layer 172 can be the same as or different from the material of the second conductive layer 176, which the invention is not limited to.

Since the embodiment has the three-dimensional connecting circuit 170 connected to the source 160a and the three-dimensional connecting circuit 170 has a smaller wire width and occupies a smaller layout area, so that in addition to effectively expanding the application range of the semiconductor device 100c to increase the aperture ratio, the embodiment can effectively save the layout area of the conductive layer (i.e., three-dimensional connecting circuit 170) on the surface 112 of the substrate 110.

Figure 4:
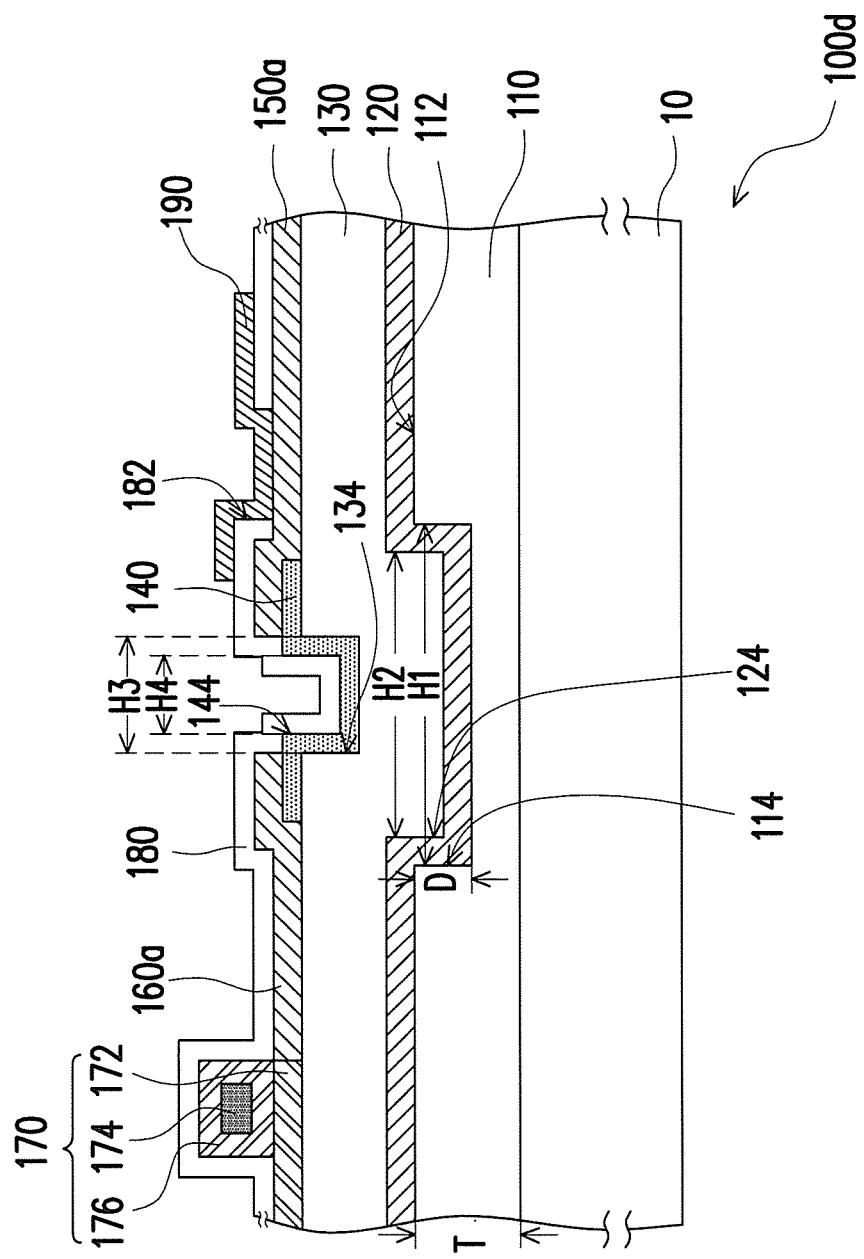
FIG. 4 is a cross-sectional diagram of a semiconductor device according to another embodiment of the invention.

FIG. 4 is a cross-sectional diagram of a semiconductor device according to another embodiment of the invention. Referring to FIG. 4, the semiconductor device 100d of the embodiment is similar to the semiconductor device 100a of FIG. 1B except that the semiconductor device 100d of the embodiment is a pixel structure.

In more details, the semiconductor device 100d of the embodiment further includes a protection layer 180 and a pixel electrode 190. The protection layer 180 is disposed on the substrate 110 and covers the semiconductor layer 140, the drain 150a, the source 160a and the fourth cavity 144. The protection layer 180 has a contact via 182 exposing a portion of the drain 150a. The pixel electrode 190 is disposed on the substrate 110 and electrically connected to the partial drain 150a exposed by the protection layer 180 through the contact via 182 thereof.

Since the substrate 110 of the embodiment has the first cavity 114 by design, the metal layer 120, the insulating layer 130, the semiconductor layer 140, the drain 150a, the source 160a and the protection layer 180 are sequentially stacked on the surface 112 of the substrate 110 and in the first cavity 114, and the pixel electrode 190 is disposed on the protection layer 180 to be electrically connected to the drain 150a through the contact via 182 to form the semiconductor device 100d in three-dimensional figure, so that the semiconductor device 100d of the embodiment is advantageous in occupying a smaller layout area and the saved area can be used to increase disposing other components (for example, electrodes, not shown), which can expand the application range of the semiconductor device 100d and increase the aperture ratio.

To sum up, the semiconductor device of the invention is designed to save the layout area of the component layer (including the metal layer, the insulating layer, the semiconductor layer, the drain and the source) on the surface of the substrate. Hence, the semiconductor device of the invention is advantageous not only in occupying a smaller layout area to allow increasing the layout area of other components on the substrate, but also in increasing the aperture ratio.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A semiconductor device, disposed on a base-plate, the semiconductor device comprising:
    a substrate, having a surface and a first cavity located at the surface;
    a metal layer, disposed on the substrate, covering the surface and covering an inner-wall of the first cavity so as to define a second cavity corresponding to the first cavity;
    an insulating layer, disposed on the metal layer and covering the metal layer and an inner-wall of the second cavity so as to define a third cavity corresponding to the second cavity;
    a semiconductor layer, disposed on the insulating layer, exposing a portion of the insulating layer and covering an inner-wall of the third cavity so as to define a fourth cavity corresponding to the third cavity;
    a drain, disposed on the semiconductor layer and covering a portion of the semiconductor layer and a portion of the insulating layer, wherein the drain exposes the fourth cavity; and
    a source, disposed on the semiconductor layer and covering a portion of the semiconductor layer and a portion of the insulating layer, wherein the source exposes the fourth cavity.

2. The semiconductor device as claimed in claim 1, wherein a material of the substrate comprises organic material or inorganic material.

3. The semiconductor device as claimed in claim 1, wherein a depth of the first cavity is ¼-9/10 of a thickness of the substrate.

4. The semiconductor device as claimed in claim 1, wherein an opening diameter of the second cavity is less than an opening diameter of the first cavity.

5. The semiconductor device as claimed in claim 1, wherein an opening diameter of the third cavity is less than an opening diameter of the second cavity.

6. The semiconductor device as claimed in claim 1, wherein an opening diameter of the fourth cavity is less than an opening diameter of the third cavity.

7. The semiconductor device as claimed in claim 1, further comprising a three-dimensional connecting circuit disposed on the insulating layer and connected to the source, wherein the three-dimensional connecting circuit comprises a first conductive layer, a filled material and a second conductive layer, the first conductive layer and the second conductive layer encapsulate the filled material and a material of the filled material is different from that of the first conductive layer and the second conductive layer.

8. The semiconductor device as claimed in claim 7, wherein the filled material comprises organic material, polymer material or polymer material containing a plurality of metallic particles.

9. The semiconductor device as claimed in claim 8, wherein a material of the metallic particles comprises silver or carbon.

10. The semiconductor device as claimed in claim 1, wherein the drain is in finger branch shape and has a plurality of first branches, the source is in finger branch shape and has a plurality of second branches, and the first branches and the second branches extend into the fourth cavity and are parallel to each other and alternately arranged.

11. The semiconductor device as claimed in claim 1, further comprising a protection layer disposed on the substrate and covering the semiconductor layer, the drain, the source and the fourth cavity, wherein the protection layer exposes a portion of the drain.

12. The semiconductor device as claimed in claim 11, further comprising a pixel electrode disposed on the substrate and connected to the portion of the drain exposed by the protection layer.

13. The semiconductor device as claimed in claim 1, wherein the semiconductor layer completely overlaps the metal layer.

* * * * *